(12) United States Patent  
Chang et al.

(10) Patent No.: US 8,810,031 B2  
(45) Date of Patent: Aug. 19, 2014

(54) WAFER-TO-WAFER STACK WITH SUPPORTING PEDESTAL

(75) Inventors: Chi-Shih Chang, Hsinchu (TW); Ra-Min Tain, Hsinchu (TW); Shyi-Ching Liau, Hsinchu (TW); Wei-Chung Lo, Hsinchu (TW); Rong-Shen Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 191 days.

(21) Appl. No.: 12/982,046

(22) Filed: Dec. 30, 2010

(65) Prior Publication Data

US 2011/0156249 A1    Jun. 30, 2011

Related U.S. Application Data

(63) Continuation-in-part of application No. 11/471,165, filed on Jun. 20, 2006, now Pat. No. 8,164,165.

(30) Foreign Application Priority Data

Oct. 26, 2005   (TW) ................................ 94137522 A

(51) Int. Cl.  
*H01L 23/48*   (2006.01)

(52) U.S. Cl.  
USPC ........... 257/737; 257/621; 257/686; 257/777; 257/778; 257/E23.011; 257/E23.169

(58) Field of Classification Search  
USPC ............................. 257/737, 621, 686, 278, 74  
See application file for complete search history.

(56) References Cited

U.S. PATENT DOCUMENTS

| | | | |
|---|---|---|---|
| 2002/0180056 A1 | 12/2002 | Wang | |
| 2003/0129829 A1* | 7/2003 | Greenlaw | 438/637 |
| 2003/0178228 A1 | 9/2003 | Sung et al. | |
| 2004/0178495 A1* | 9/2004 | Yean et al. | 257/723 |
| 2006/0043571 A1* | 3/2006 | Mousa et al. | 257/700 |
| 2006/0043573 A1* | 3/2006 | Hedler et al. | 257/700 |
| 2009/0209063 A1* | 8/2009 | Lee et al. | 438/109 |

* cited by examiner

*Primary Examiner* — Thanh Nguyen  
(74) *Attorney, Agent, or Firm* — Birch, Stewart, Kolasch & Birch, LLP

(57) ABSTRACT

An electronic device having a stacked structure is provided. The electronic device includes a first electronic layer, a second electronic layer disposed on the first electronic layer, and at least a post. The first electronic layer has a first interface, and including a first substrate and a first device layer disposed on the first substrate. The first interface is located between the first substrate and the first device layer, and the first device layer has a surface opposite to the first interface. The post is arranged in the first device layer, and extending from the first interface to the surface of the first device layer.

40 Claims, 15 Drawing Sheets

WAFER-TO-WAFER STACK WITH SUPPORTING PEDESTAL

CROSS-REFERENCE TO RELATED APPLICATIONS

This application is a Continuation-In-Part of co-pending application Ser. No. 11/471,165 filed on Jun. 20, 2006, and for which priority is claimed under 35 U.S.C. §120; and this application claims priority of Application No. 94137522 filed in Taiwan on Oct. 26, 2005 under 35 U.S.C. §119; the entire contents of all are hereby incorporated by reference.

FIELD OF THE INVENTION

The present invention relates to a wafer stack structure, and in particular to a three dimensional wafer stack having at least one supporting pedestal formed therein.

BACKGROUND OF THE INVENTION

As the rapid development of the semiconductor process, more and more electronic products can be provided with higher performance, higher portability and more compactness. Under such a development trend, the size of the chip used for the electronic products should be miniaturized, but the integrated circuits contained in the chip are becoming more and more complicated. However, advancing scaling down of chip size and increasing the design complexity of the integrated circuits entail a multiplicity of problems, such as, the crosstalk effect and the thermal issues on the chip, or the proximity effect in the lithography and etching processes. Recently, a novel three dimensional wafer structure design has been gradually developed in order to overcome the problems resulting from the miniaturization of the chip Please refer to FIG. 1, which schematically shows a conventional three dimensional wafer stack structure according to the prior art. As can be seen from FIG. 1, a wafer stack 100' includes a first wafer 10', a second wafer 20' and a third wafer 30', each of which consists of a substrate 12', 22', 32' and a device layer 14', 24', 34'. Furthermore, there further exits a bonding layer 13' between two adjacent wafers for constructing the wafer stack. Specifically, the respective device layers of the first and the second wafers are arranged to configure them as a face to face wafer stack, while the respective device layers of the second and the third wafers are arranged to configure them as a back to face wafer stack. Furthermore, as can be seen from FIG. 1, each wafers 10', 20', 30' further has plural circuit devices 16', 26', 36' in the respective device layer 14', 24', 34', which are electrically interconnected through the signal via 15'. Some low-k materials 18', 28' are disposed adjacent to those circuit devices 16' and 26' for the need of isolation.

In such a three dimensional wafer stack structure, like the abovementioned wafer stack 100', more wafers might be repeatedly stacked up, if necessary. However, a new problem may occur in such a three dimensional wafer stack structure. The low-k materials 18', 28', which exist in the respective device layer and are used for allowing the conducting wires thereof being arranged closely, usually has porous structure, and might be destroyed by compression stresses resulting from the stacking structure or by the thermal stresses resulting from the heat generated by the circuit devices. Therefore, those low-k materials 18', 28' are vulnerable. Once the structure of the low-k material 18' is damaged, the isolation between the circuit device 16' and the other components in the same device layer 14' would be no longer effective and the functions of the circuit device 16' will eventually fail.

Based on the above, it is necessary to find a new approach to prevent the low-k materials 18' existing in the device layer 14' from being damaged by the compression or thermal stresses. In order to overcome such issues, a novel three dimensional wafer stack having therein at least one supporting pedestal and the manufacturing method therefor are provided. The supporting structure, such as a pedestal or a post, is disposed in a device layer, stands at an interface between the device layer and the substrate, and extends to the upper surface of the device layer, to protect the electronic devices in the same layer.

SUMMARY OF THE INVENTION

It is a first aspect of the present invention to provide an electronic device having a stacked structure. The electronic device includes a first electronic layer, a second electronic layer disposed on the first electronic layer, and at least a post. The first electronic layer has a first interface, and including a first substrate and a first device layer disposed on the first substrate. The first interface is located between the first substrate and the first device layer, and the first device layer has a surface opposite to the first interface. The post is arranged in the first device layer, and extending from the first interface to the surface of the first device layer.

According to a second aspect of the present invention, an electronic device having a first electronic layer and at least a post is provided. The electronic device includes a first electronic layer. The first electronic layer has a first interface, and includes a first substrate and a first device layer disposed on the first substrate. The first interface is located between the first substrate and the first device layer, and the first device layer has a surface opposite to the first interface. The post is arranged in the first device layer, and extending from the first interface to the surface of the first device layer.

According to a third aspect of the present invention, an electronic layer having a substrate, a device layer, an interface, and at least a post is provided. The device layer is disposed on the substrate and has a surface. The interface is located between the substrate and the device layer, and opposite to the surface. The post extends from the interface to the surface.

Based on the above, a novel three dimensional wafer stack structure and the manufacturing method therefor are provided. In Comparison with the conventional three dimensional wafer stack, the three dimensional wafer stack structure according to the present invention is further provided with at least one pedestal arranged in each chip area of the device layer for preventing the low-k materials existing in the device layer from being damaged by the stresses. Moreover, the pedestals, which are usually formed by a metal material having a relatively high thermal conductivity, constructed by a columnar structure or a lateral structure, and can run through the first and the second substrates, are also used as the thermal conductive devices, in order to release the heat generated in the device layers. Furthermore, at least one of the pedestals, or posts, is electrically coupled to an contact of an electronic device in the device layer, and extends to the surface of the device layer, to allow a signal from the electronic device to be detected at the surface of the device layer.

The above objects and advantages of the present invention will become more readily apparent to those ordinarily skilled

DETAILED DESCRIPTION OF THE PREFERRED EMBODIMENT

Figure 1:
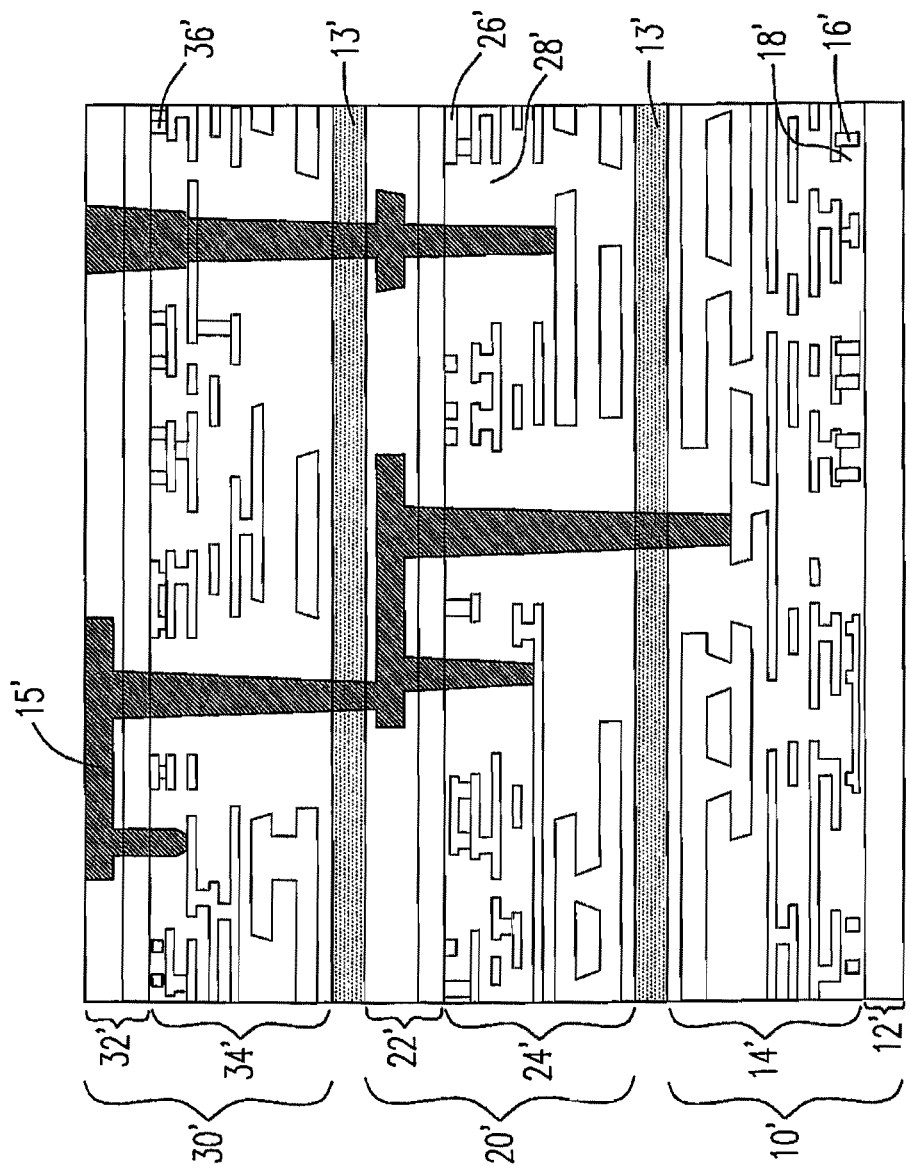
FIG. 1 is a diagram schematically illustrating a conventional three dimensional wafer stack according to the prior art.

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Please refer to FIGS. 2(A)-2(D), which respectively shows some of the different embodiments of the three dimensional wafer stack according to the present invention. As can be seen from FIG. 2(A), the three dimensional wafer stack 100 according to a first embodiment of the present invention includes a first wafer 10 and a second wafer 20, both of which are arranged face-up, so as to configure the first and the second wafers 10, 20 as a back to face (or back to front) wafer stack. Specifically, the first and the second wafers 10, 20 further include a first and a second substrates 12, 22 as well as a first and a second device layers 14, 24, respectively. In each of the first and the second device layers, a plurality of circuit devices 16, 26, which are generally designed to be the integrated circuit chips, and at least one low-k layers 18, 28 are formed therein. Typically, the low-k layers 18, 28 are made of the conventional low-k material, such as silicon dioxide, or the porous materials. Moreover, in, order to electrically interconnect the respective circuit devices 16, 26 arranged in the first and the second wafers 10, 20, at least one signal via 15 is formed therebetween, so that the respective circuit devices 16, 26 in the wafers 10, 20, could be electrically interconnected to each other.

In addition to the above-mentioned structural feature, the three dimensional wafer stack 100 according to the first embodiment of the present invention further includes at least one supporting structure 25, such as a pedestal, existing in the first and the second device layers 14, 24 for preventing the low-k materials 18, 28, from being damaged by the compression stresses resulting from the stacking of the wafers or the thermal stresses generated from the heat generated by the circuit devices 16, 26.

Figure 2A:
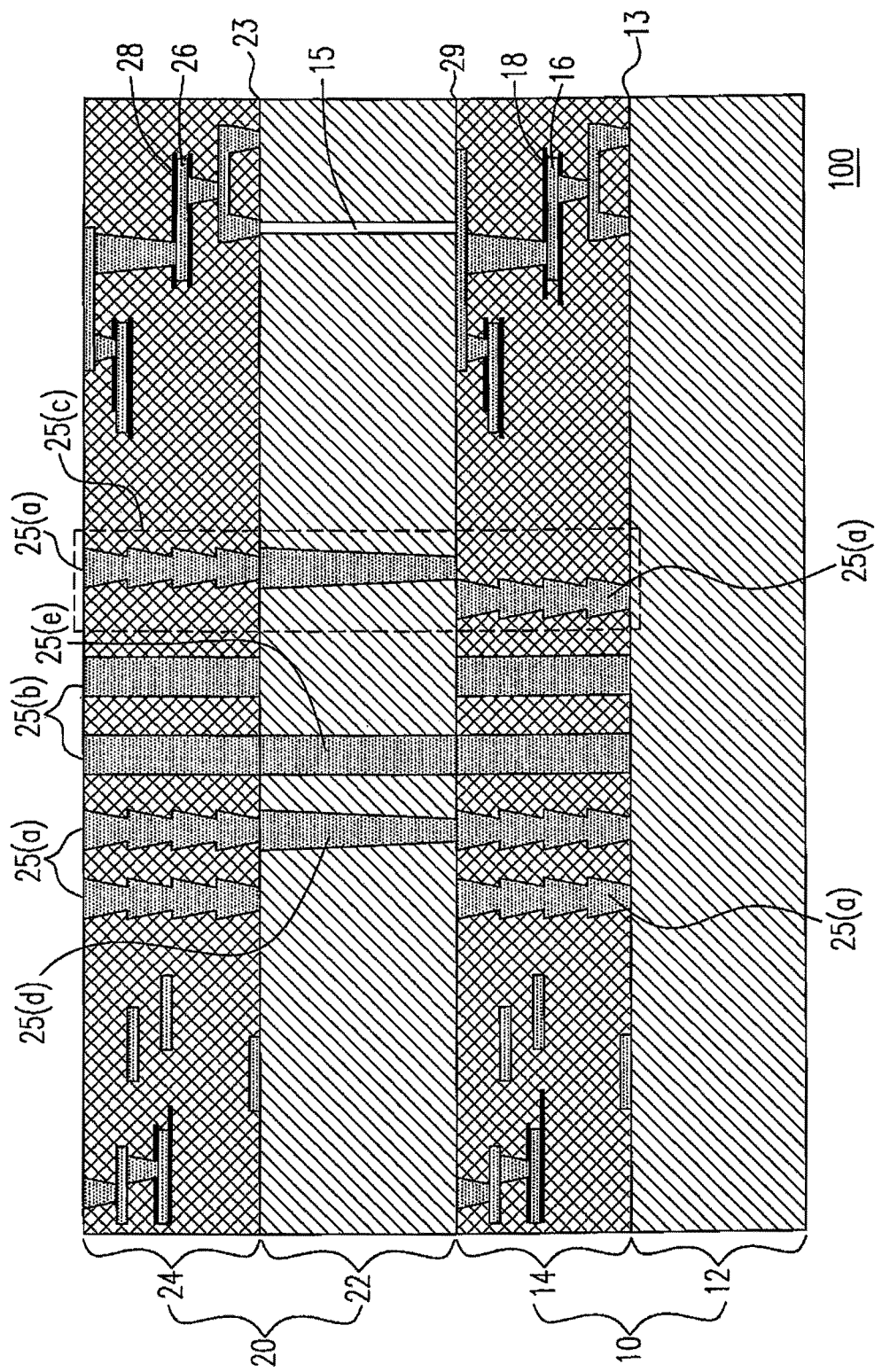
FIG. 2(A) is a diagram schematically illustrating a three dimensional wafer stack according to a first embodiment of the present invention.

As shown in FIG. 2(A), the supporting structure 25 is arranged on the location of the circuit devices (i.e. the chip area in the device layer) and stands on a solid foundation, which is made up by either the silicon substrate, the silicon dioxide on silicon substrate and the silicon nitride/silicon dioxide on silicon substrate, and, extends vertically upward to a further rigid surface 29, which is made of the same materials as those forming the solid foundation. However, the solid foundation or the rigid surface excludes the silicon oxide or the silicon nitride existing in the low-k materials 18, 28, which is used for the wiring purpose. Furthermore, in a preferred embodiment, the supporting structure 25 may run through the first and/or the second substrates 12, 22 for mitigating the possible stress impact resulting from the deformation of the respective substrates.

Moreover, as shown in FIG. 2(A), the supporting structure 25 in such a back to face wafer stack 100 can be arranged to be different configurations (a)-(c). In configuration (a), the supporting structure 25 in the respective device layers 14, 24 is fabricated through a layer-by-layer deposition process, so that the supporting structure in the device layer is configured as a layer-by-layer supporting structure which is vertically aligned and extending upward in each wafer. In configuration (b), the supporting structure is formed within a through hole which is fabricated by means of a drilling process or an etching process. Either a physical driller or a laser beam can be utilized for the drilling process. In configuration (c), it shows that the supporting structure in each wafer should be vertically aligned, including the part of the supporting structure running through the substrate 22. However, the part of the supporting structure in the first wafer 10 is not necessary to be vertically aligned with that formed in the second wafer 20. That is to say that the supporting structures in each wafer can be designed and arranged independently in such back to face wafer stack.

Figure 2B:
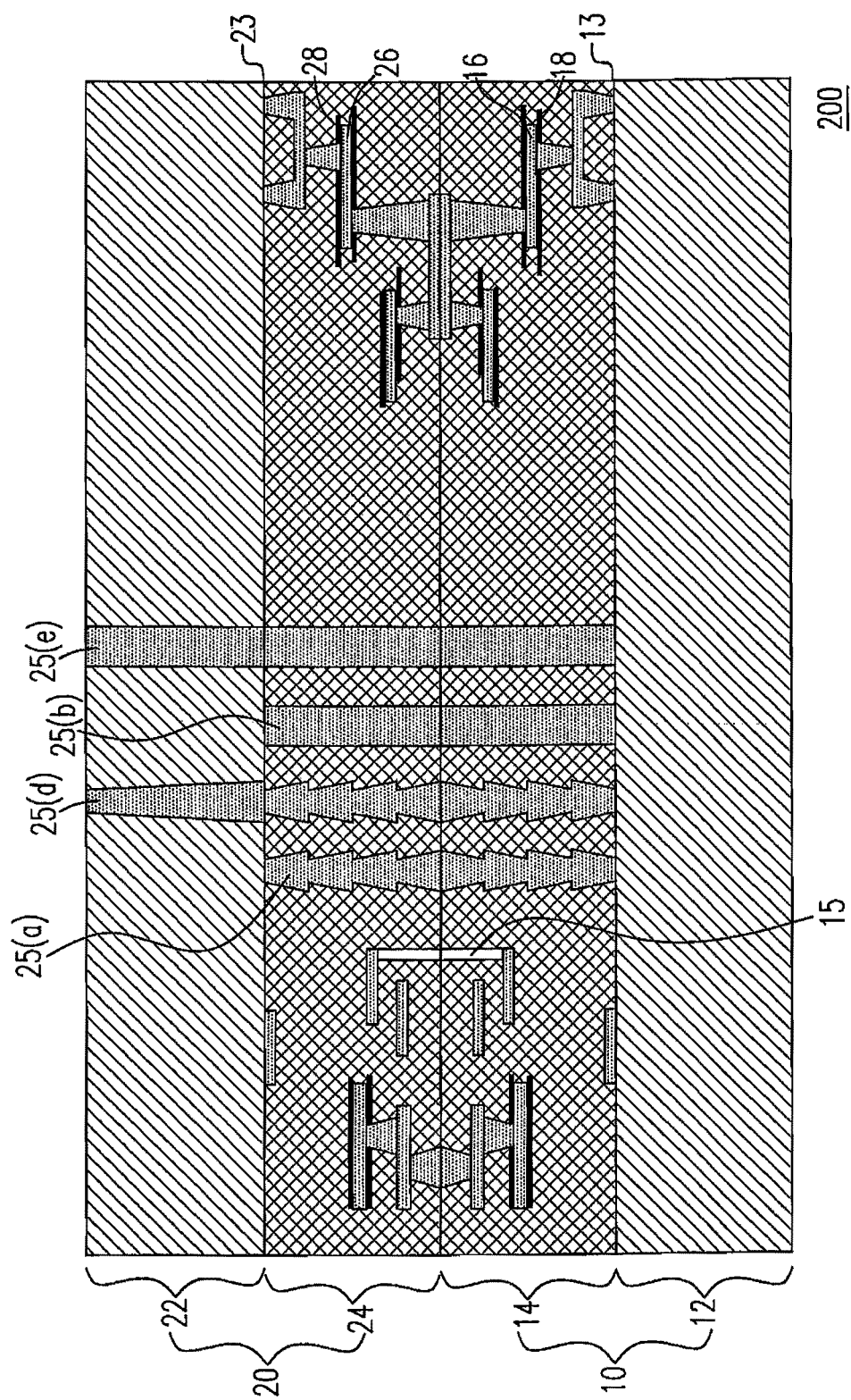
FIG. 2(B) is a diagram schematically illustrating a three dimensional wafer stack according to a second embodiment of the present invention.

Please further refer to FIG. 2(B), which shows a further face to face wafer stack according to the second embodiment of the present invention. In comparison with the back to face wafer stack 100 as shown in FIG. 2(A), the second wafer 20 is arranged face down, so as to configure the first and the second wafers 10, 20 as a face to face wafer stack 200. Since the second wafer is arranged face down, the device layer 24 of the second wafer 20 is adjacent to the device layer 14 of the first device wafer 10. Accordingly, not only the thickness of the first and the second device layers but also the interconnection distance between the circuit devices (or chips) 16, 26 in the respective device layers 14, 24 can be remarkably reduced. Similarly, the supporting structure 25 in the face to face wafer stack can be arranged to be different configurations (a) and (b) as shown in FIG. 2(B). In configuration (a), the supporting structure 25 is similarly fabricated through a layer-by-layer deposition process, and the layer-by-layer supporting structure is vertically aligned and extending upward in the respective wafers 10, 20. The supporting structure 25 also can run through the first and/or the second substrates 12, 22 for mitigating the possible stresses impact resulting from the deformation of the respective substrates 12, 22. However, it should be noted that the part of the supporting structure running through the substrate is formed through the drilling process or the etching process rather than the deposition process. Furthermore, in configuration (b), the supporting structure is similarly formed within a through hole which is fabricated by means of a drilling process or an etching process, as described in the first embodiment. It also should be noted that the supporting structures formed in each wafer of the face to face wafer stack 200 should be arranged to be vertically aligned, so as to provide an enforceable support in the first and the second device layers. Therefore, the configuration (c) as shown in FIG. 2(A) is incapable of being applied in such face to face wafer stack 200.

Figure 2C:
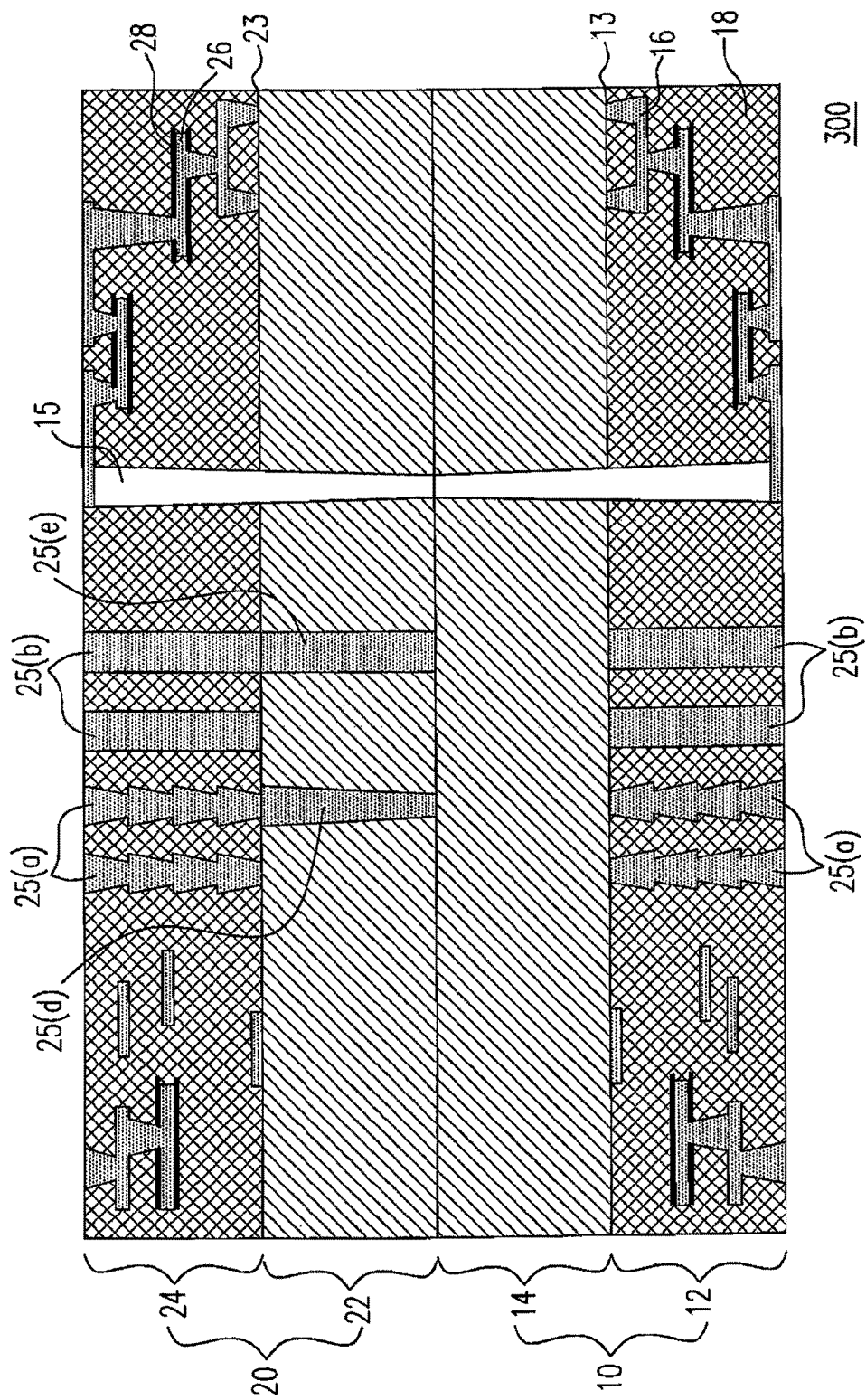
FIG. 2(C) is a diagram schematically illustrating a three dimensional wafer stack according to a third embodiment of the present invention.
Figure 2D:
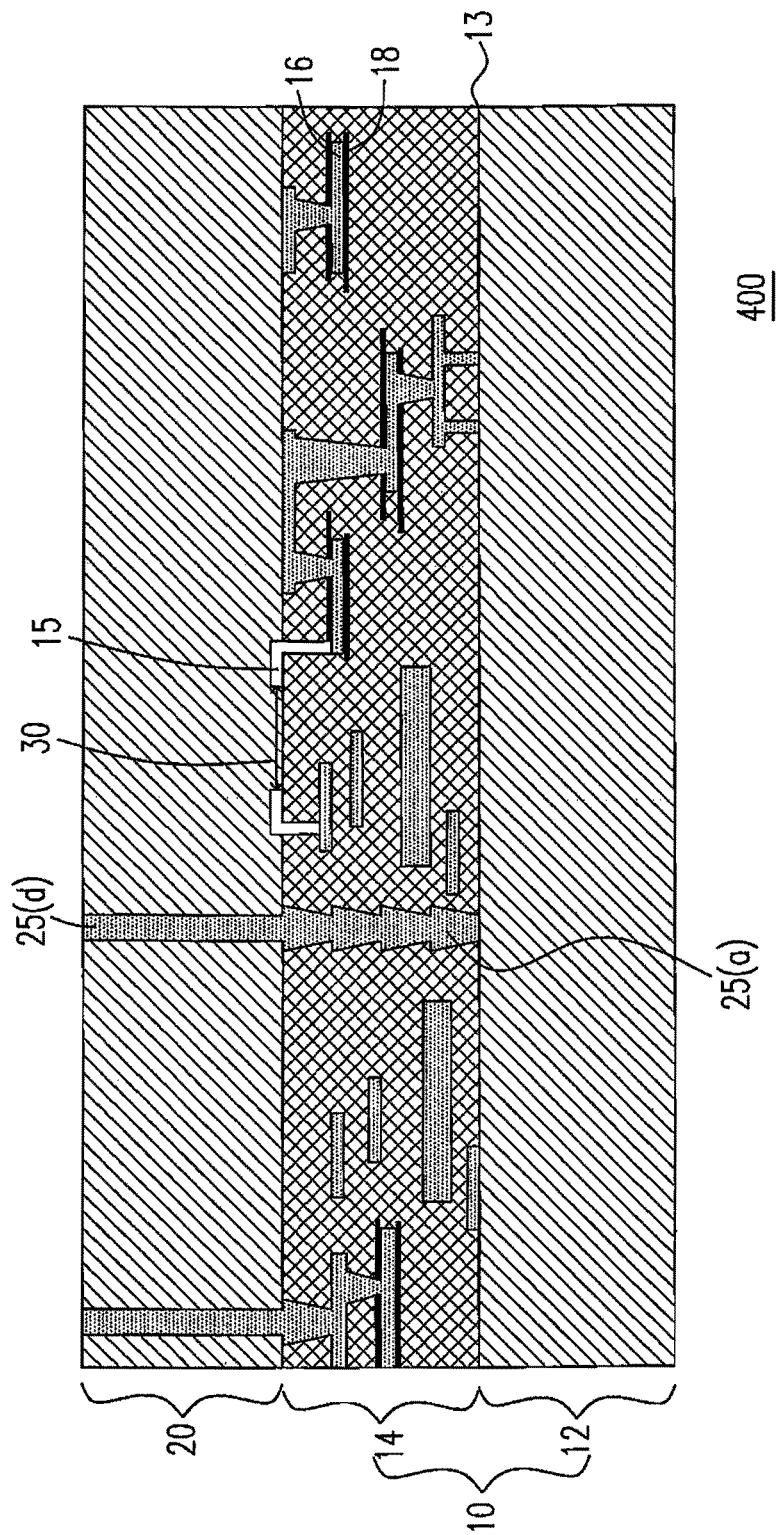
FIG. 2(D) is a diagram schematically illustrating a three dimensional wafer stack according to a fourth embodiment of the present invention.

Please refer to FIG. 2(C), which shows a further back to back wafer stack according to the third embodiment of the present invention. In comparison with the back to face wafer stack 100 and the face to face stack 200, as shown in FIG. 2(A) and FIG. 2(B), respectively, the back to back wafer stack 300 according to the third embodiment of the present invention has almost the same components as those described in the first and the second embodiments. However, the only difference is that the first wafer 10 is arranged face down while the second wafer is arranged face up, so that the three dimensional wafer stack shown in FIG. 2(C) is configured as a back to back wafer stack. Although the back to back wafer stack 300 has a longer interconnection distance than the back to face wafer stack 100 and the face to face wafer stack 200, it is especially advantageous when the first and the second wafers are applied in different line width processes. Therefore, the back to back wafer stack 300 is also applicable to the certain cases in which the first and the second wafers are suitable for being applied in different line width processes Please refer to FIG. 2(D), which shows a further three dimensional wafer stack according to a fourth embodiment of the present invention. The wafer stack 400 according to the fourth embodiment of the present invention is an alternative embodiment of the face to back wafer stack 100 according to the first embodiment of the present invention, except the second wafer thereof is a dummy wafer, which has no device layer and no circuit device formed therein. Accordingly, the second wafer 20 in this embodiment is used for the protection or wiring purpose or used for electrically connecting with some core circuit which is applied in a lower resolution (wider line width) process, such as an ESD circuit, a passive element circuit, a driving circuit and a power/ground shielding circuit 30. However, it should be noted that the structural features of the supporting structure in this embodiment are almost similar to or compatible with those formed in the abovementioned embodiments.

Figure 3A:
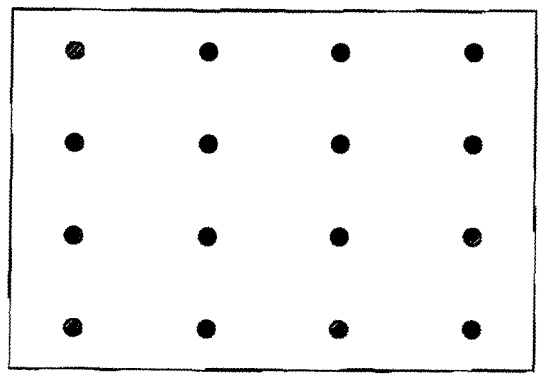
FIGS. 3(A) and 3(B) are top view diagrams schematically illustrating the arrangement patterns of the pedestals in each chip area.
Figure 3B:
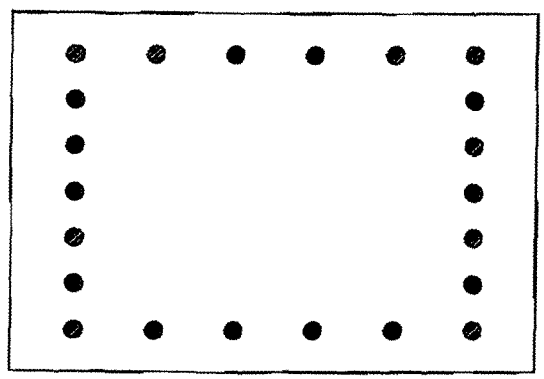

Please further refer to FIGS. 3(A) and 3(B), which respectively shows the top view diagrams of the exemplary arrangement patterns of the pedestals in each chip area (or in each circuit device area) of the device layer. As shown in FIG. 3 (A) and FIG. 3(B), when there exist a plurality of supporting structures (or pedestals) in each device layer, the supporting structures in each chip area (or circuit device area) are arranged in a pattern, such as the rectangular array (shown in FIG. 3(A)), the peripheral array (shown in FIG. 3(B)), or even any other symmetrical array.

In addition, the supporting structures in an alternative embodiment can be designed to include a columnar structure part and a lateral structure part, as shown in FIGS. 2(A)-2(D). Moreover, the supporting structures are made of the metal material having a relatively high thermal conductivity for enhancing the heat conduction in those three dimensional wafer stacks 100-400. In addition to the abovementioned design, in such a case that the supporting structure running through the respective substrates of the wafers, the heat generated in the respective device layers can be effectively transferred to the outside of the wafer stack.

Figure 4:
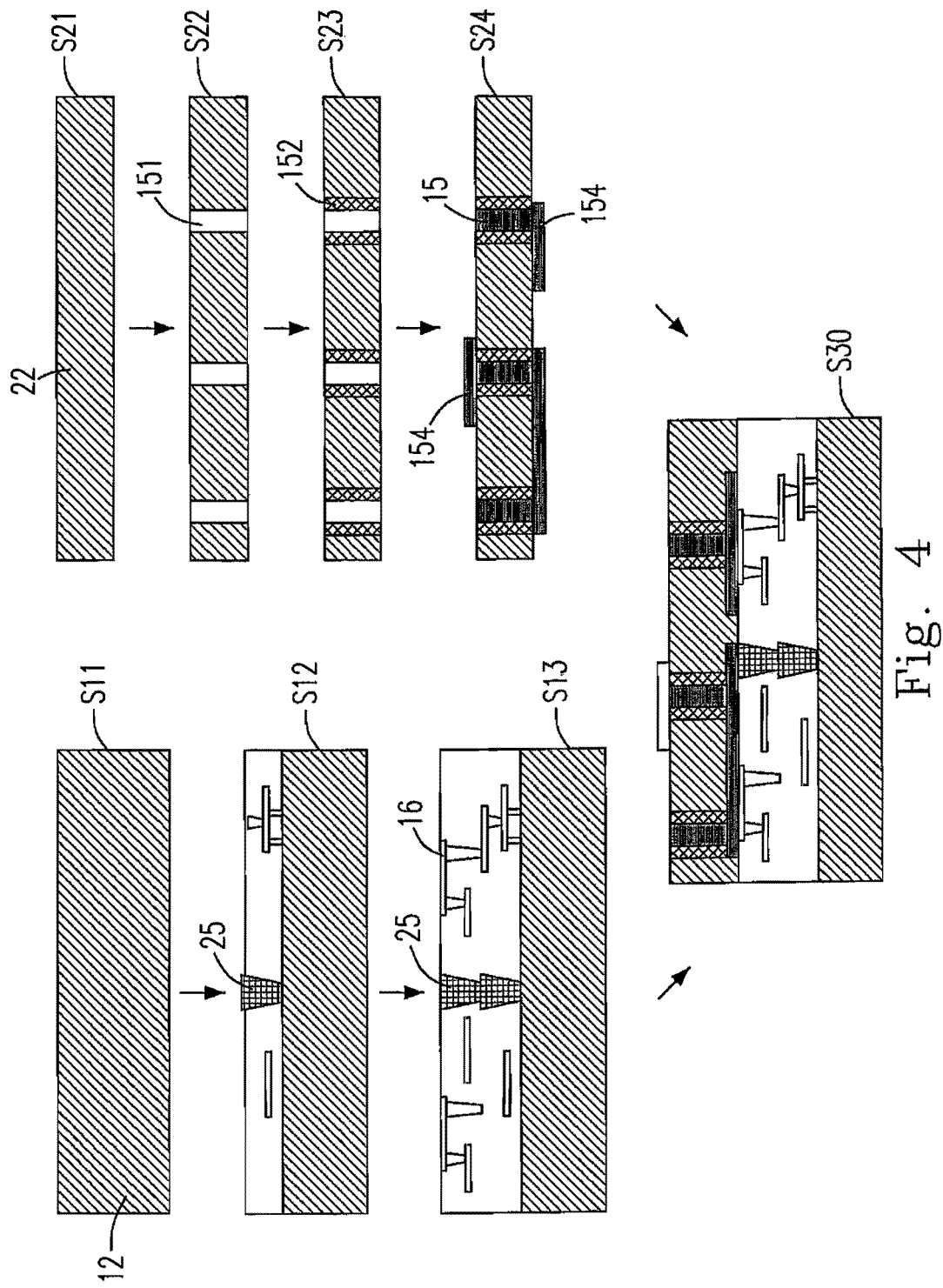
FIG. 4 is a flowchart of a method for manufacturing the three dimensional wafer stack according to the present invention.

Please refer to FIG. 4 which shows a flowchart of a method for manufacturing a three dimensional wafer stack according to the present invention. As described in the abovementioned embodiments, the wafer stack according to the present invention is exemplarily formed by a first and a second wafers which are applied to an identical line width process or the different line width processes. As shown in FIG. 4, the first and the second wafers are first processed independently, and then bonded to each other. In step S11, a substrate of a first wafer is provided. In steps S12 and S13, the circuit devices 16 together with the dielectric layers and the supporting structures 25 are formed on the substrate 12 through the layer-by-layer deposition process. On the other hand, in step S21, a substrate 22 of a second wafer is provided. In step S22, a plurality of through holes 151 is formed on the substrate 22 through a chemical etching process or a drilling process, such as a UV laser process or a $CO_2$ laser process. In Step S23, an insulator layer 152 is formed around the side walls of the through holes. In step S24, the through holes 151 are filled up with an electrically conductive material or a signal via 15, so as to electrically interconnect the both sides of the second wafer. In a preferred embodiment, the step S24 further include the step of forming an electrically conductive layer 154 on one side or both sides of the second wafer, so as to make the circuit devices in each side be electrically interconnected with each other. After finishing the respective processes of the first and the second wafers, the substrate 22 of the second wafer is bonded to the device layer of the first wafer, so as to complete the three dimensional wafer structure, as shown in step S30 of FIG. 4. Accordingly, the three dimensional wafer stack with the supporting structure is manufactured thereby. In addition thereto, it should be noted that the abovementioned three dimensional wafer stack can be extended to a three dimensional chip stack with the supporting structures formed therein, so as that a novel chip stack having a stress protecting device and a novel chip stack with a supporting structure can be further provided.

Figure 5A:
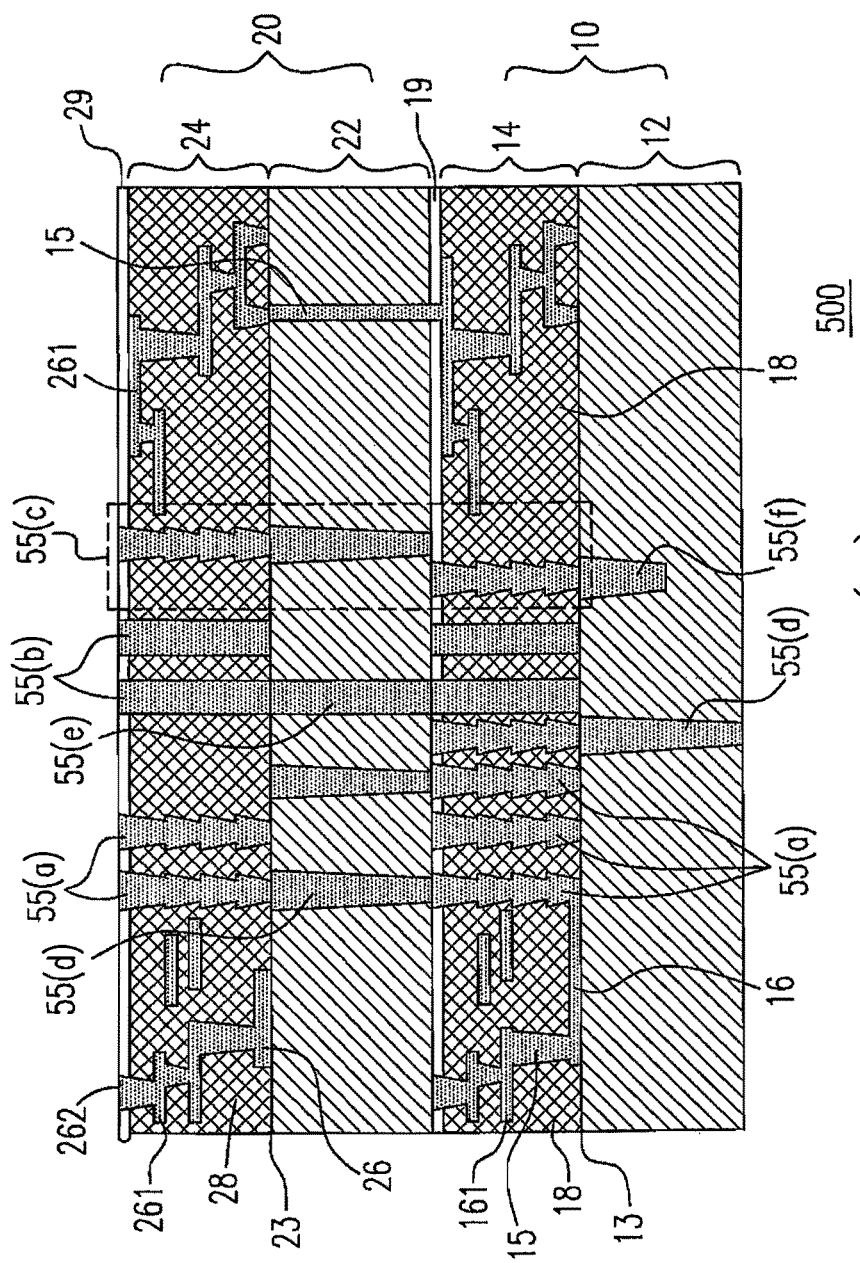
FIG. 5(A) is a diagram schematically illustrating a three dimensional wafer stack according to a fifth embodiment of the present invention.

Please refer to FIGS. 5(A)-5(D), which respectively show the fifth to the eighth embodiments of the three dimensional wafer stack according to the present invention. According to the illustrations in FIG. 5(A), which is similar to FIG. 2(A), an electronic device 500 having a stacked structure includes a first electronic layer 10, a second electronic layer 20 disposed on the first electronic layer 10, and at least a post 25. Noted that the first and the second electronic layers 10, 20 can be wafers or chips, according to preferred embodiments. The first electronic layer 10 includes a first substrate 12 and a first device layer 14, which is disposed on the first substrate 12. The first electronic layer 10 has an interface 13. The first interface 13 is located between the first substrate 12 and the first device layer 14. It can be observed that, the first device layer 14 and the first substrate 12 each have a surface opposite to the first interface 13, respectively. In the first device layer 14, at least a low-k material 18 is disposed adjacent to a circuit device 16. According to one embodiment, the first device layer 14 includes a first passivation layer 19 covering all the electronic devices except the elements to be exposed at the surface of the first device layer, such as a pad. For this particular case, the surface of the first device layer 14 is on the surface of the first passivation layer 19. Serving the same utilization of the pedestals 25 in FIG. 2(A), at least a post 55 in FIG. 5(A) is arranged in the first device layer 14, and extends from the first interface 13 to the surface of the first device layer 14. Preferably, the first substrate 12 has a solid foundation to support the post 55. The solid foundation is made of one of a silicon substrate, a silicon dioxide on a silicon substrate and a silicon nitride/silicon dioxide on a silicon substrate. Therefore, the post 55 stands firmly on the solid foundation.

According to the present invention, embodiments of the post 55 includes the pedestal 25 set forth above. However, there might be other embodiments of the post 55 that vertically support the device layers or the substrates in the electronic device. Referring to FIG. 5(A), there are several configurations of the post 55, namely 55(*a*)-(*f*), based on either the physical structure or the manufacturing process. The posts 55(*a*) and 55(*b*), i.e. the configurations (a) and (b), exist in the device layer 14 or 24. The posts 55(*d*), 55(*e*) and 55(*f*) are disposed in the substrate 12 or 22. The posts 55(*a*), 55(*d*) and 55(*f*) are fabricated through a layer-by-layer deposition process, while the posts 55(*b*) and 55(*e*) are formed by means of a drilling process or an etching process. Either a physical driller or a laser beam, for examples UV laser process or CO2 laser process, can be utilized for the drilling process. In configuration (c), it shows that the supporting structure in each wafer should be vertically aligned, including the part of the post 55(*d*) running through the substrate 22. However, the part of the supporting structure in the first wafer 10 is not necessary to be vertically aligned with that formed in the second wafer 20. That is to say that the supporting structures in each wafer can be designed and arranged independently in such back to face wafer stack. The structure of the post 55(*f*) is similar to that of the post 55(*d*), except that the bottom of the post 55(*d*) reaches the surface of the substrate.

The second electronic layer 20 includes a second substrate 22 and a second device layer 24, which is disposed on the second substrate. The second electronic layer 20 also has an interface 23. The second interface 23 is located between the second substrate 22 and the second device layer 24. Likewise, the second device layer 24 and the second substrate 22 each has a surface opposite to the second interface 23 respectively. Practically, the second electronic layer 20 comprises one of an ESD circuit, a passive element circuit, a driving circuit and a power/ground shielding circuit. In the second device layer 24, at least a low-k material 28 is disposed adjacent to a device 26. According to one embodiment, the second device layer 24 includes a second passivation layer 29 covering all the electronic devices except contact points such as a pad 262 that is electrically connected to a conducting wire 261 and provides signals from an electronic device 26. For this particular case, the surface of the second device layer 24 is on the surface of the second passivation layer 29.

Referring to FIG. 5(A), which illustrates a typical face-to-back or back-to-face stack, the surface of the second substrate is disposed on and faces the surface of the first device layer. When the post 55 extends to the surface of first device layer 14, it actually contacts to the surface of the second substrate which is usually a silicon substrate. Since the silicon substrate is right on top of the post 55, and the post 55 stands on the first substrate 12, the structure of the combination of the first and the second substrate 12, 22 and the post 55 is similar to a roof, a floor and a column of a house. The post 55 existing in the first device layer can bear the external stress and protect the low-k materials 18 from being damaged. According to a preferred embodiment of the present invention, the post 55 further extends to the second interface 23, to allow the post 55 be firmly stick into the second substrate 22. The post 55 is preferably further extending to the surface of the second device layer 24, to further protect the low-k materials 28 in the second device layer 24 from being damaged.

It can be observed that, the signal from the device 26 can be detected through the pad 262 at the surface of the second device layer 24. However, the signal from the circuit device 16 can not be detected by the similar way, for the surface of the first device layer 14 is covered by the second electronic layer 20. To solve the mentioned issue, it can be observed that the post 55(*a*) the very left is coupled to the circuit device 16 at one end, extending all the way to the surface of the second device layer 24, and exposed to the air. Therefore, when performing engineering analysis or trouble shooting, one may detect the signals generated by the circuit device 16 at the first device layer located at the bottom of the three-dimensional stack structure with the aid of the post 55(*a*).

Figure 5B:
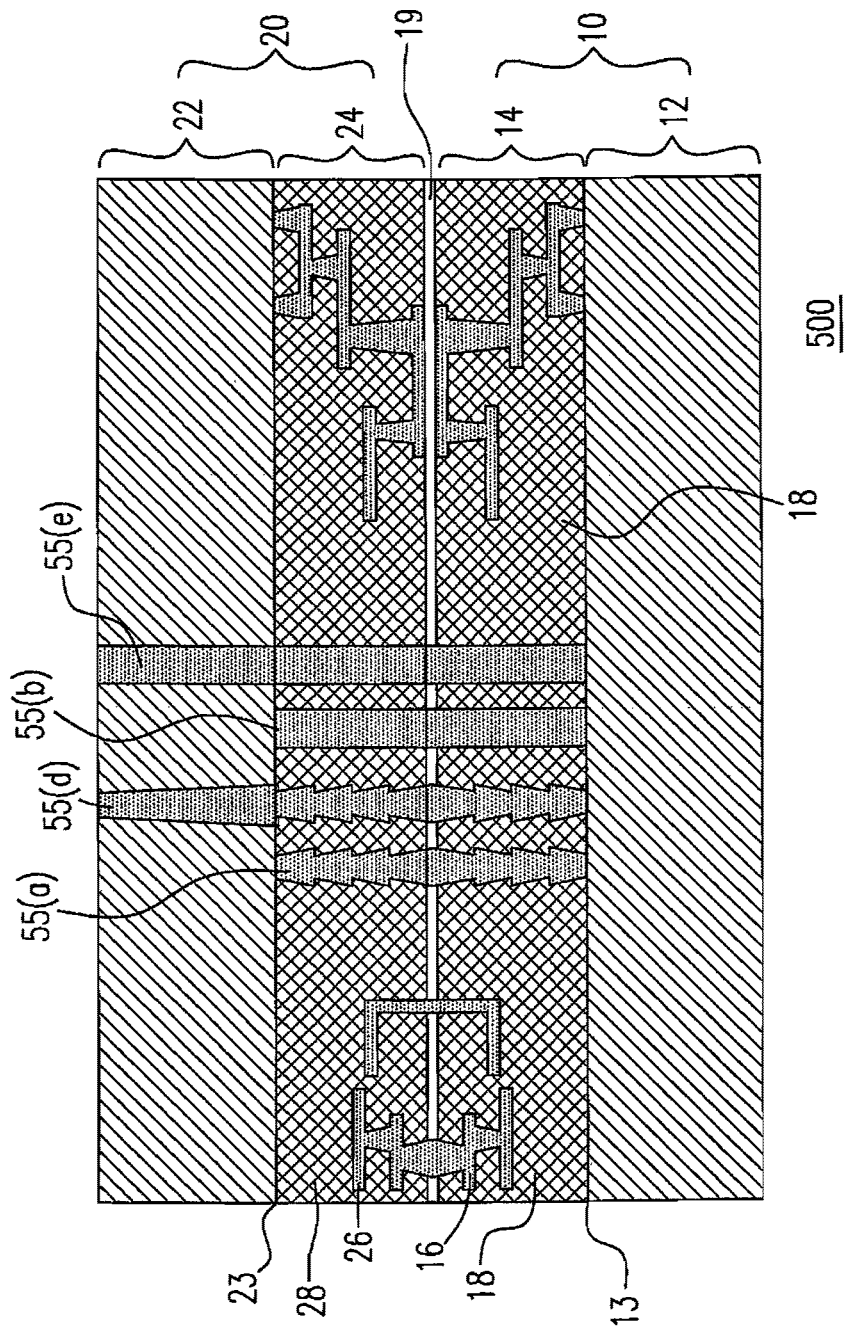
FIG. 5(B) is a diagram schematically illustrating a three dimensional wafer stack according to a sixth embodiment of the present invention.

Please refer to FIG. 5(B), which illustrates a face-to-face stack structure, the surface of the second device layer 24 is disposed on and faces the surface of the first substrate 14. Likewise, at least a post 55 (might be made by different process and thus formed of different configurations 55(*a*) and 55(*b*)) is located on first interface 13, preferably on a solid foundation, and extends to the surface of the first device layer.

Figure 5C:
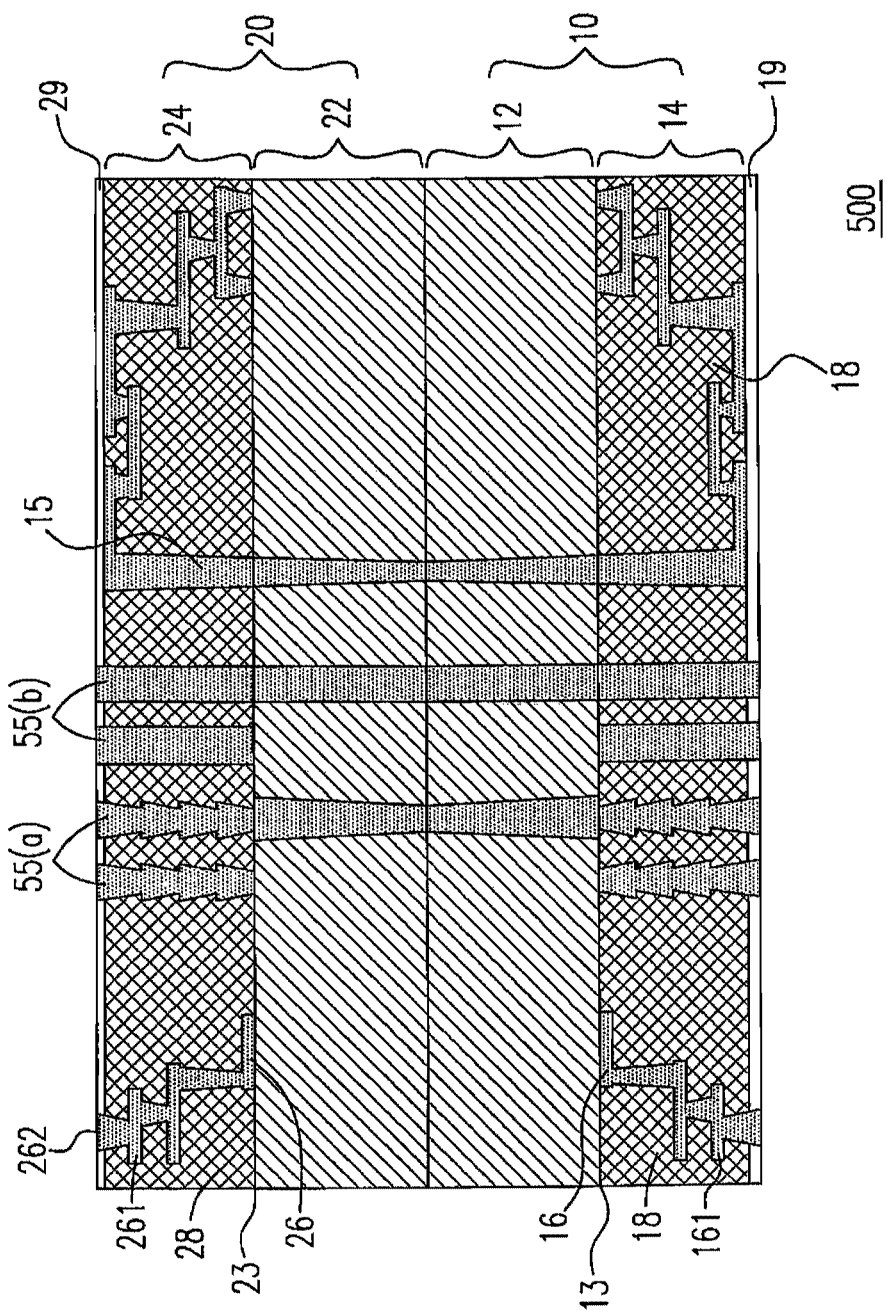
FIG. 5(C) is a diagram schematically illustrating a three dimensional wafer stack according to a seventh embodiment of the present invention.

Please refer to FIG. 5(C), which illustrates a back-to-back stack structure, the surfaces of the second substrates 22 is disposed on and faces the surface of the second substrate 12. Preferably, each of the first and the second substrates 12, 22 comprises at least a solid foundation. The solid foundation is made of one of silicon substrate, silicon dioxide on a silicon substrate and a silicon nitride/silicon dioxide on a silicon substrate. Likewise, at least a post 55 (might be made by different process and thus formed of different configurations 55(*a*) and 55(*b*)) is located on first interface 13, preferably on a solid foundation, and extends to the surfaces of the device layers 14 and 24. The post 55 may even extends to the surface of the second substrate 22, to provide contact to the electronic devices (not shown) in the first device layer 14.

Figure 5D:
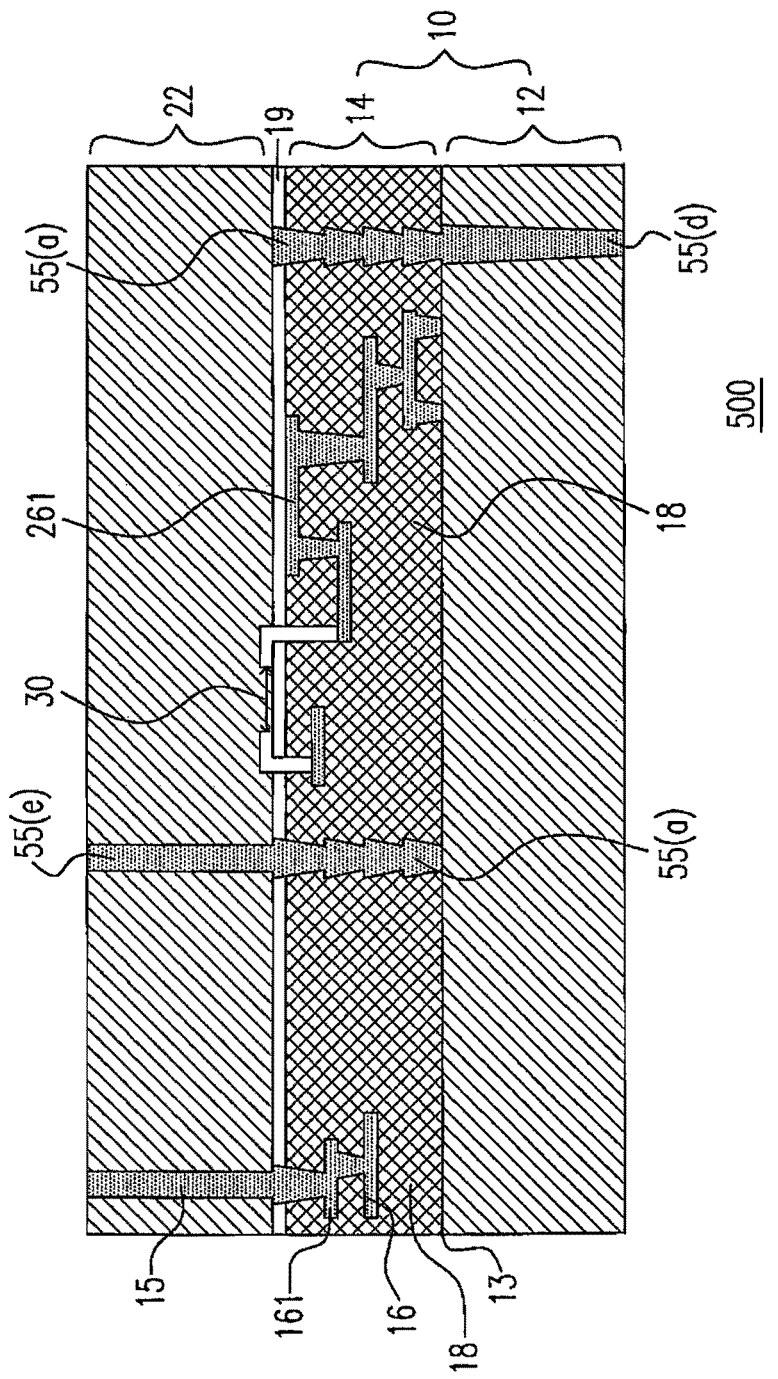
FIG. 5(D) is a diagram schematically illustrating a three dimensional wafer stack according to an eighth embodiment of the present invention.

Please refer to FIG. 5(D), which illustrates a stack structure of a bare substrate on a wafer or a chip, where the second device layer has a second substrate 22 only. The different configurations of the post 55 have been introduced hereinbefore, and there is no need to repeat.

Figure 6A:
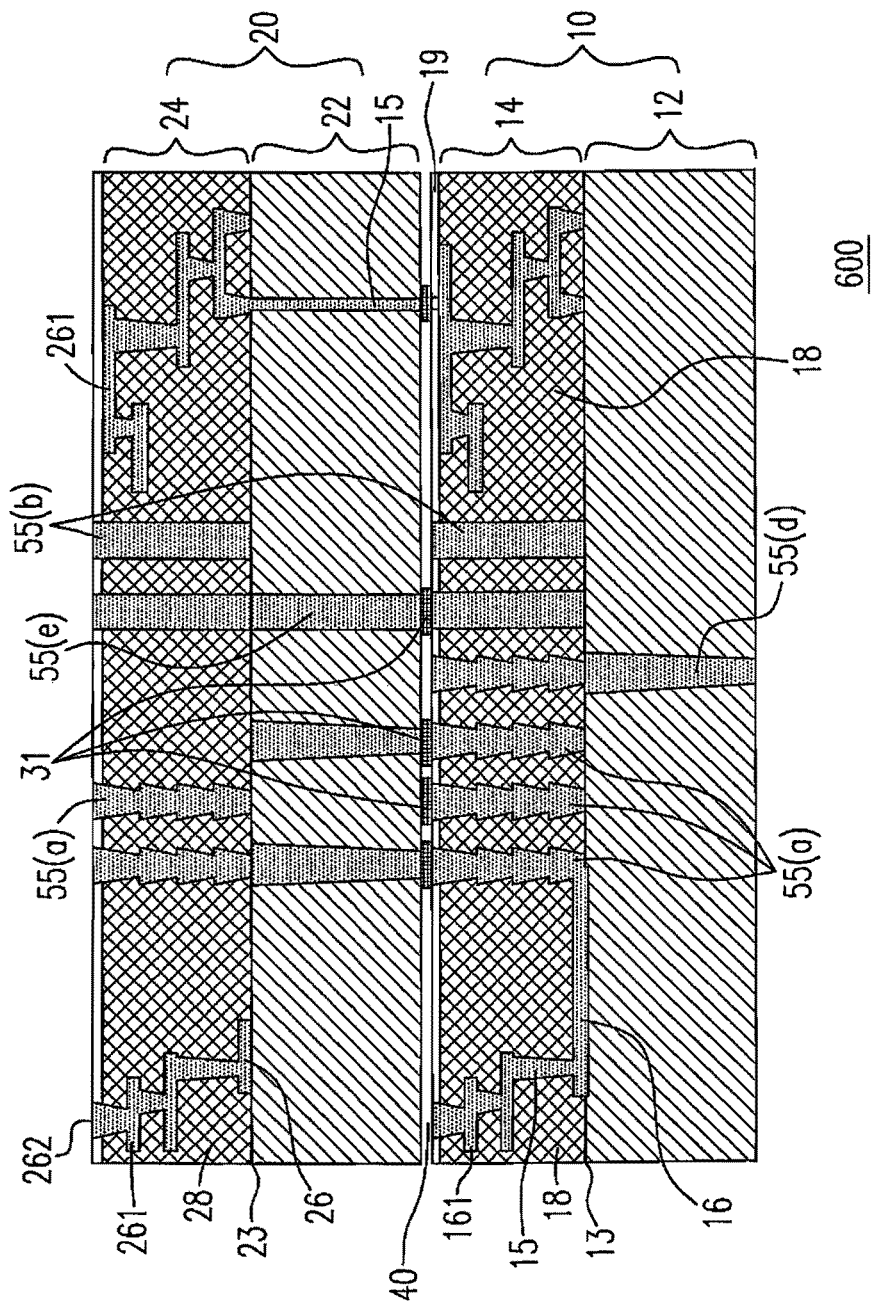
FIG. 6(A) is a diagram schematically illustrating a three dimensional wafer stack according to a ninth embodiment of the present invention.
Figure 6B:
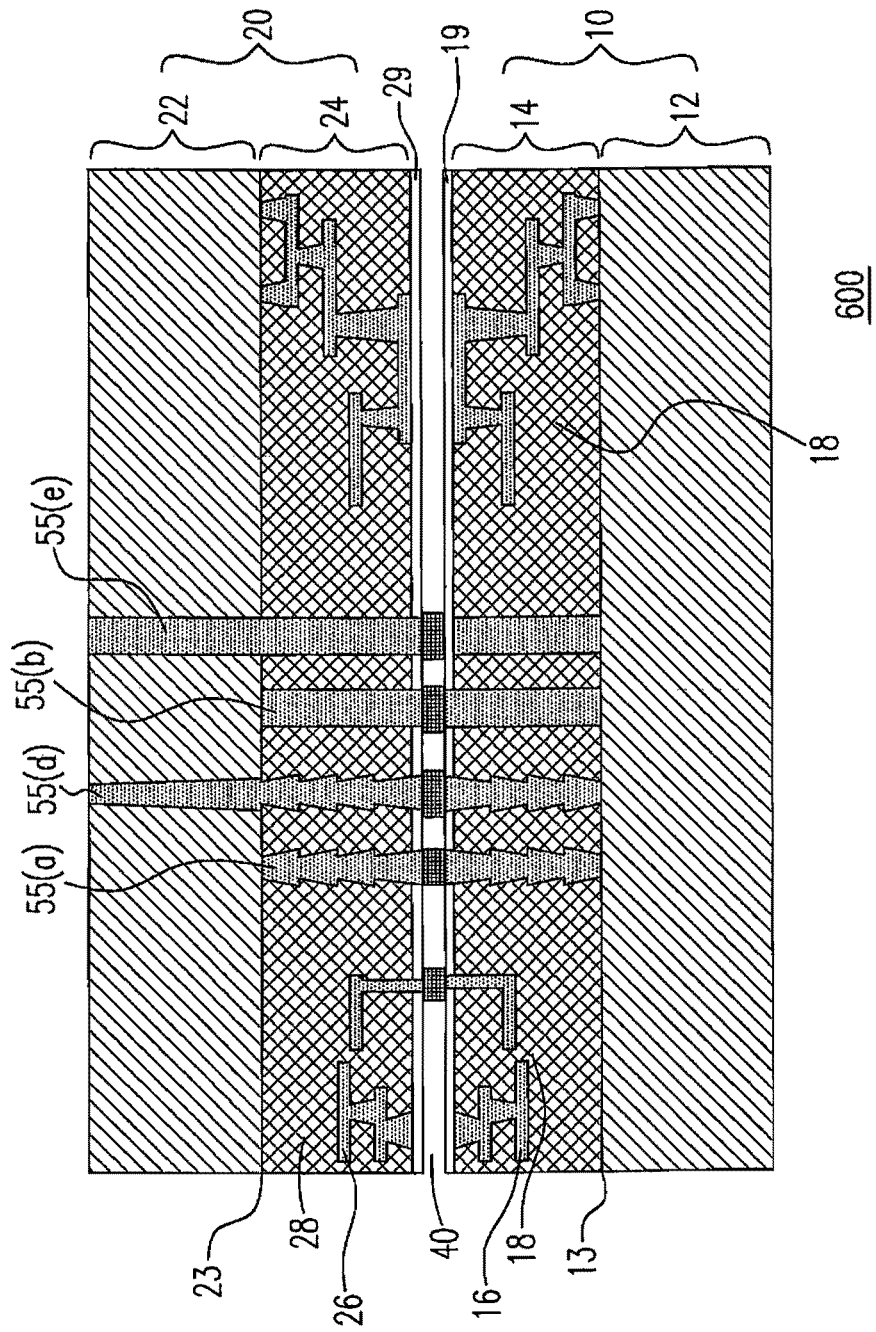
FIG. 6(B) is a diagram schematically illustrating a three dimensional wafer stack according to a tenth embodiment of the present invention.
Figure 6C:
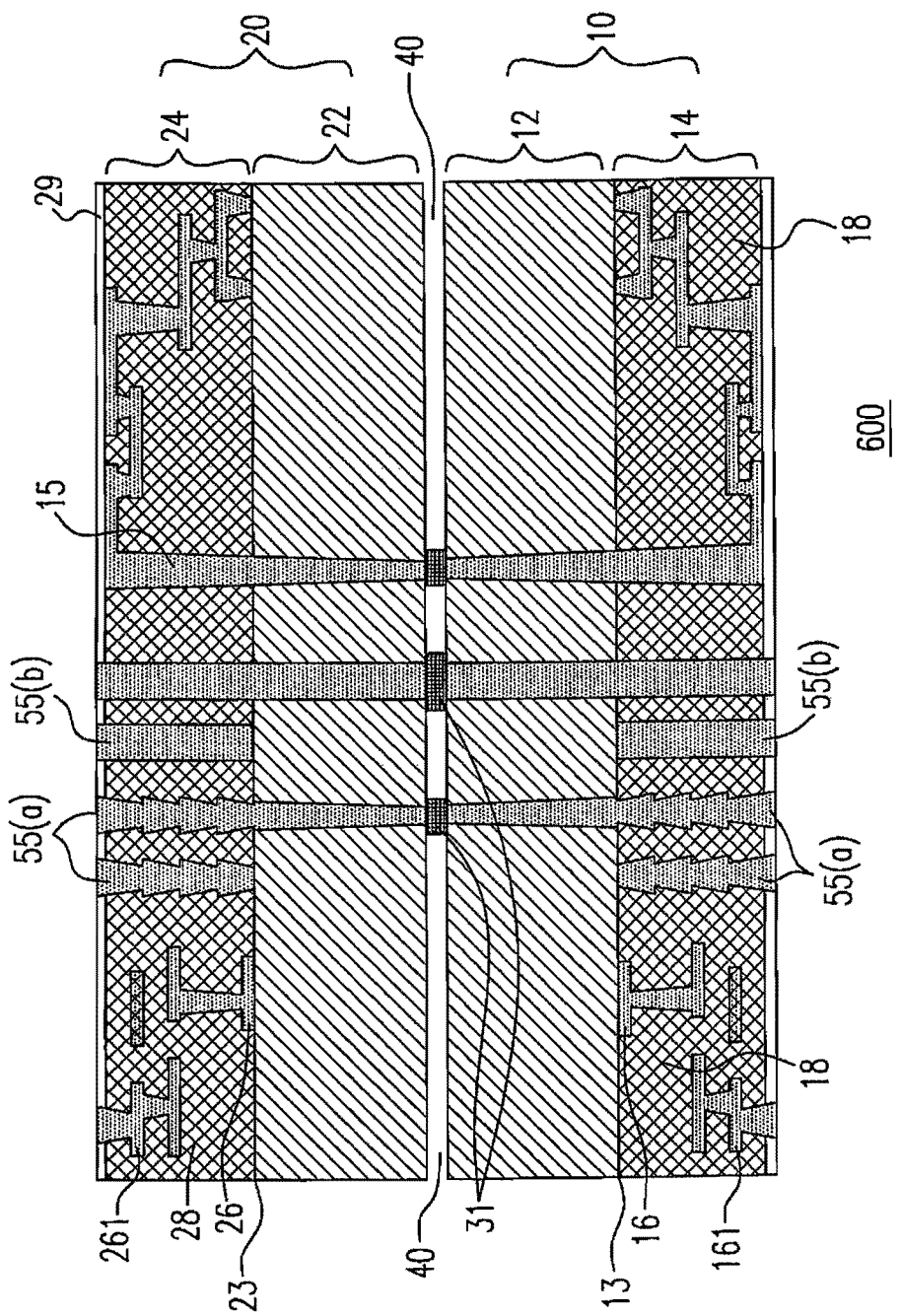
FIG. 6(C) is a diagram schematically illustrating a three dimensional wafer stack according to an eleventh embodiment of the present invention.
Figure 6D:
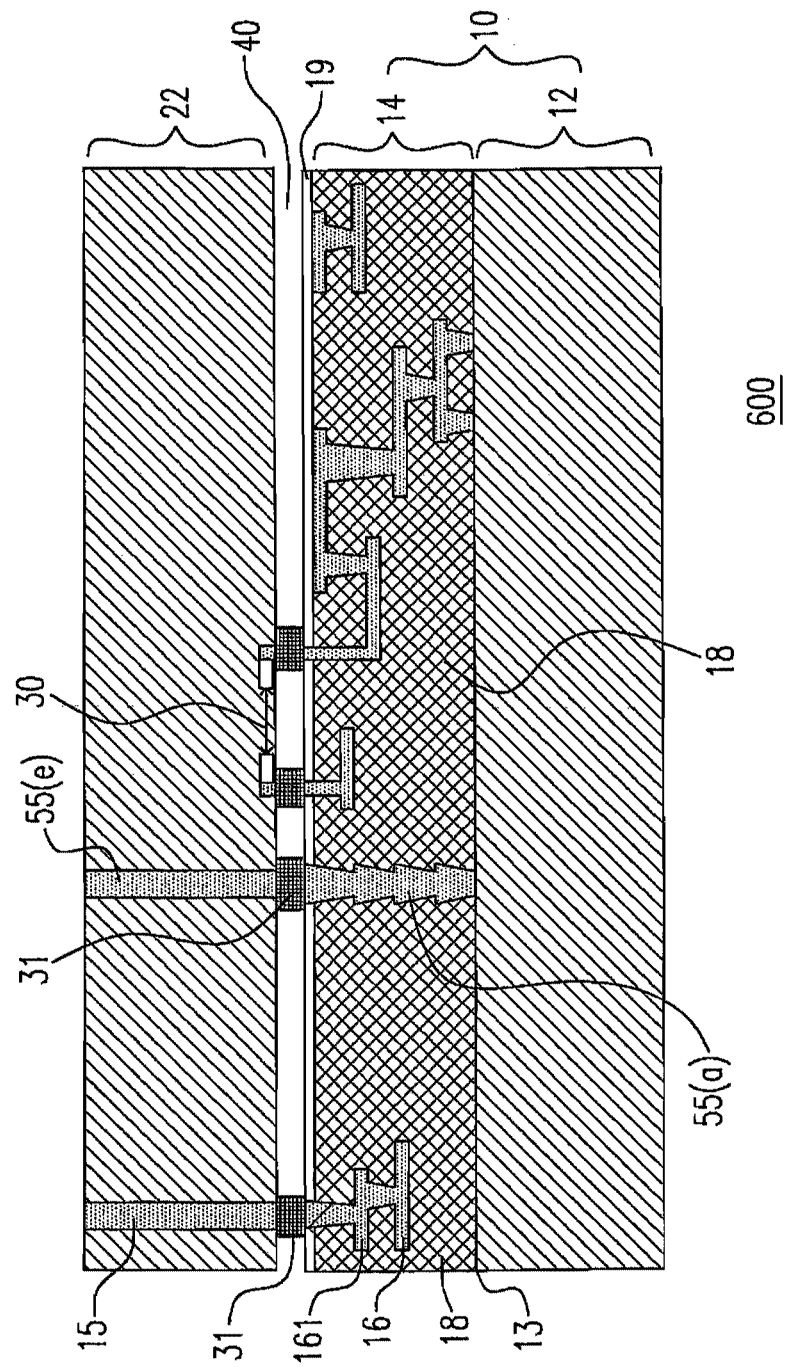
FIG. 6(D) is a diagram schematically illustrating a three dimensional wafer stack according to a twelfth embodiment of the present invention.

Please refer to FIGS. 6(A)-6(D), which respectively show additional embodiments of the three dimensional wafer stack according to the present invention. It is obviously that the basic illustrations of the FIGS. 6(A)-6(D) are similar to those of 5(A)-5(D) respectively, except that the electronic device 600 further comprises a gap 40 between the first and second electronic layers 10, 20, and a joint 31 located in the gap 40 for continuing the extension of the post 55 to the second interface (or the surface of the second substrate opposite to the gap 40 in FIG. 6(D)). The join 31 is preferably made of a solder material, which could be an electrically-conductive-only material, a thermally-conductive-only material, or a both-electrically-and-thermally-conductive material. Referring to FIGS. 3(A) and 3(B), a plurality of the post 55 can be disposed in different locations of the stack structure to enhance the mechanical strength thereof. The join 31 is used for connecting the respective posts 55 at different electronic layers, according to a preferred embodiment of the present invention. Referring to FIG. 6(A), a joint 31 can also be disposed on a post 55 and extends the contact of the post 55(a) to the surface of the second substrate 22 if the gap 40 exists, and therefore the post 55 is able to bear the mechanical stress and protect the low-k material 18 in the first device layer 14.

Since the gap 40 is open to the air, all the elements located in the gap 40 would be disposed to moisture and corrosive materials carried by the air, and eventually be damaged due to corrosion. Therefore, an adhesive material is filled into the gap 40 after the joins 31 have been disposed therein, according to a preferred embodiment of the present invention.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An electronic device having a stacked structure, comprising:
    a first electronic layer having a first interface, and including a first substrate and a first device layer disposed on the first substrate, the first device layer having at least one circuit device and a first passivation layer, wherein the first interface is located between the first substrate and the first device layer, and the first passivation layer has a first surface opposite to the first interface;
    a second electronic layer disposed on the first electronic layer, and having a second interface, a second substrate and a second device layer, wherein the second interface is located between the second substrate and the second device layer;
    a gap located between the first electronic layer and the second electronic layer;
    at least one first step-structured metal post arranged in the first device layer, and extending from the first interface to the gap, without being electrically connected to the circuit device;
    at least one joint located in the gap and connected to the at least one first step-structured metal post;
    a first straight metal post arranged in the second substrate, connected to the at least one joint, and extending to the second interface; and
    at least one second step-structured metal post arranged in the second device layer and connected to the first straight metal post.

2. An electronic device according to claim 1, wherein the second substrate has a surface opposite to the second interface, and the surface of the second substrate is disposed on and faces the first surface of the first passivation layer.

3. An electronic device according to claim 2, wherein the second device layer has a second surface opposite to the second interface, and the second step-structured metal post further extends to the second surface.

4. An electronic device according to claim 2,
    wherein the joint includes one of an electrically-conductive-only material, a thermally-conductive-only material, and a both-electrically-and-thermally-conductive material.

5. An electronic device according to claim 2, wherein the first substrate has a surface opposite to the first interface, and the first step-structured metal post further extends to the surface of the first substrate.

6. An electronic device according to claim 2, wherein the first substrate has a surface opposite to the first interface, and the first step-structured metal post further extends to a location between the interface and the surface of the first substrate.

7. An electronic device according to claim 1, wherein the first electronic layer is a wafer and the second electronic layer is a wafer.

8. An electronic device according to claim 1, wherein the first electronic layer is a wafer and the second electronic layer is a chip.

9. An electronic device according to claim 1, wherein the first electronic layer is a chip and the second electronic layer is a chip.

10. An electronic device according to claim 1, wherein each of the first and the second substrates further comprises a solid foundation including one of a silicon dioxide on a silicon substrate and a silicon nitride/silicon dioxide on a silicon substrate.

11. An electronic device according to claim 10, wherein the first step-structured metal post stands on the solid foundation of the first substrate.

12. An electronic device according to claim 1, wherein the electronic device further comprises a plurality of posts, and the posts are arranged in a symmetrical array.

13. An electronic device according to claim 1, wherein the first step-structured metal post is one of a columnar structure and a lateral structure.

14. An electronic device according to claim 1, wherein the first step-structured metal post comprises a metal material having a relatively high thermal conductivity.

15. An electronic device according to claim 1, wherein the first device layer comprises a low-k material.

16. An electronic device according to claim 1, wherein the first and the second electronic layers have a same circuit wire width.

17. An electronic device according to claim 1, wherein the second electronic layer has a circuit wire width wider than that of the first electronic layer.

18. An electronic device according to claim 17, wherein the gap between the first electronic layer and the second electronic layer is filled with an adhesive material.

19. An electronic device according to claim 1, wherein the second electronic layer comprises one of an ESD circuit, a passive element circuit, a driving circuit and a power/ground shielding circuit.

20. An electronic device according to claim 19, wherein the gap between the first electronic layer and the second electronic layer is filled with an adhesive material.

21. An electronic device according to claim 1, further comprising a pad, wherein the second electronic layer further comprises a second passivation layer to cover the respective device layer surface and allow the pad to be exposed for an electrical connection.

22. An electronic device according to claim 21, wherein the gap between the first electronic layer and the second electronic layer is filled with an adhesive material.

23. An electronic device according to claim 1, wherein the first step-structured metal post is made of a first material, the first straight metal post is made of a second material, the second step-structured metal post is made of a third material, and the first, second and third materials are the same.

24. An electronic device, comprising:
- a first electronic layer having a first interface, and including a first substrate and a first device layer disposed on the first substrate, the first device layer having at least one circuit device and a first passivation layer, wherein the first interface is located between the first substrate and the first device layer, and the first passivation layer has a first surface opposite to the first interface;
- a second electronic layer disposed on the first electronic layer and having a second interface;
- a gap located between the first electronic layer and the second electronic layer;
- at least one first step-structured metal post arranged in the first device layer, and extending from the first interface to the gap, without being electrically connected to the circuit device;
- at least one joint located in the gap and connected to the at least one first step-structured metal post;
- a first straight metal post arranged in the second electronic layer, connected to the at least one joint, and extended to the second interface; and
- at least one second step-structured metal post arranged in the second device layer and connected to the first straight metal post.

25. An electronic device according to claim 24, wherein the second electronic layer has a second substrate.

26. An electronic device according to claim 25, wherein the first electronic layer is a wafer and the second electronic layer is a wafer.

27. An electronic device according to claim 25, wherein the first electronic layer is a wafer and the second electronic layer is a chip.

28. An electronic device according to claim 25, wherein the first electronic layer is a chip and the second electronic layer is a chip.

29. An electronic device according to claim 25, wherein the second electronic layer has a second surface located opposite to the gap, and the second step-structured metal post further extends to the second surface.

30. An electronic device according to claim 25, wherein the first substrate has a surface opposite to the first interface, and the first step-structured metal post further extends to the surface of the first substrate.

31. An electronic device according to claim 25, wherein the first substrate has a surface opposite to the first interface, and the first step-structured metal post further extends to a location between the first interface and the surface of the first substrate.

32. An electronic device according to claim 25, wherein the second substrate has a surface, the electronic device has a second interface between the second substrate and the first device layer, the surface of the second substrate is opposite to the second interface, and the joint includes one of an electrically-conductive-only material, a thermally-conductive-only material, and a both-electrically-and-thermally-conductive material.

33. An electronic device according to claim 25, further comprising a pad, wherein the first passivation layer covers the surface of the first device layer while allowing the pad to be exposed for an electrical connection.

34. An electronic device according to claim 24, wherein the gap is filled with an adhesive material.

35. An electronic device according to claim 24, wherein the first step-structured metal post is made of a first material, the first straight metal post is made of a second material, the second step-structured metal post is made of a third material, and the first, second and third materials are the same.

36. A stack-structured electronic device, comprising:
- a first electronic layer having a first interface, and including a first substrate and a first device layer disposed on the first substrate and having at least one circuit device and a first passivation layer, wherein the first interface is located between the first substrate and the first device layer, and the first passivation layer has a first surface opposite to the first interface;
- a second electronic layer disposed on the first electronic layer, and having a second interface, a second substrate and a second device layer, wherein the second interface is located between the second substrate and the second device layer;
- at least one joint located between the first electronic layer and the second electronic layer;
- at least one first solid step-structured metal post arranged in the first device layer, extending from the first interface, and connected to the at least one joint; and
- a first solid straight metal post arranged in the second substrate, connected to the at least one joint, and extending to the second interface.

37. A stack-structured electronic device according to claim 36, further comprising a gap located between the first electronic layer and the second electronic layer.

38. A stack-structured electronic device according to claim 36, further comprising at least one second solid step-structured metal post arranged in the second device layer, and connected to the first straight metal post.

39. A stack-structured electronic device according to claim 36, wherein the first solid step-structured metal post is made of a first material, the first solid straight metal post is made of a second material, and the first and second materials are the same.

40. A stack-structured electronic device according to claim 36, further comprising at least one second solid straight metal post arranged in the second device layer, and connected to the first straight metal post.

* * * * *